US007565585B2

United States Patent
Ellis et al.

(10) Patent No.: US 7,565,585 B2
(45) Date of Patent: Jul. 21, 2009

(54) INTEGRATED REDUNDANCY ARCHITECTURE AND METHOD FOR PROVIDING REDUNDANCY ALLOCATION TO AN EMBEDDED MEMORY SYSTEM

(75) Inventors: Wayne F. Ellis, Jericho, VT (US); Kevin W. Gorman, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 942 days.

(21) Appl. No.: 10/707,797

(22) Filed: Jan. 13, 2004

(65) Prior Publication Data

US 2005/0160310 A1    Jul. 21, 2005

(51) Int. Cl.
*G11C 29/00* (2006.01)
(52) U.S. Cl. ........................ 714/718; 714/733
(58) Field of Classification Search ............... None
See application file for complete search history.

(56) References Cited

U.S. PATENT DOCUMENTS

| | | | | |
|---|---|---|---|---|
| 5,764,878 | A | | 6/1998 | Kablanian et al. ...... 395/182.05 |
| 5,987,632 | A | * | 11/1999 | Irrinki et al. ................. 714/711 |
| 6,011,734 | A | * | 1/2000 | Pappert ....................... 365/200 |
| 6,111,801 | A | * | 8/2000 | Brady ......................... 365/201 |
| 6,243,307 | B1 | * | 6/2001 | Kawagoe ..................... 365/201 |
| 6,408,401 | B1 | | 6/2002 | Bhavsar et al. ................. 714/7 |
| 6,574,757 | B1 | | 6/2003 | Park et al. .................... 714/710 |
| 6,928,377 | B2 | * | 8/2005 | Eustis et al. ................. 702/118 |
| 2002/0196680 | A1 | | 12/2002 | Ooishi et al. ................. 365/200 |
| 2002/0196683 | A1 | * | 12/2002 | Ohtani et al. ............... 365/200 |
| 2003/0028710 | A1 | | 2/2003 | Shinohara et al. ........... 711/104 |
| 2003/0123301 | A1 | | 7/2003 | Jang et al. ................... 365/200 |
| 2005/0055173 | A1 | * | 3/2005 | Eustis et al. ................ 702/118 |

* cited by examiner

*Primary Examiner*—Cynthia Britt
*Assistant Examiner*—Guerrier Merant
(74) *Attorney, Agent, or Firm*—Downs Rachlin Martin PLLC

(57) ABSTRACT

An integrated redundancy architecture for an embedded memory system whereby a third memory element is added to the redundancy architecture such that all row and column fails may be stored in real-time. Architecture (20) includes a first memory element (22) (FME 22) having a register (24), a second memory element (26) (SME 26) having a register (28), a third memory element (30) (TME 30) having a register (32), and a finite state machine (34) (FSM 34) having a decision algorithm (36). FME (22), SME (26), TME (30), and FSM (34) are electrically connected to a built-in self-test (BIST) module (38). BIST module (38) outputs failed row and column addresses (40), also referred to as "fails," for rows and columns that are identified as defective during the BIST to the memory elements and FSM (34). FSM (34) allocates redundancy resources of the memory system according to decision algorithm (36).

13 Claims, 2 Drawing Sheets though it should be understood that the present invention is not limited to this (or any other) particular embodiment, but rather is intended to cover any architectures, integrated circuits, and methods that fairly fall within the broad scope of the appended claims. In the drawings, like elements include like element numbers.

INTEGRATED REDUNDANCY ARCHITECTURE AND METHOD FOR PROVIDING REDUNDANCY ALLOCATION TO AN EMBEDDED MEMORY SYSTEM

BACKGROUND OF INVENTION

1. Field of the Invention

The present invention relates generally to an integrated redundancy architecture, and more particularly to an integrated redundancy architecture for providing real-time built-in self-test (BIST) redundancy allocation to an embedded memory system.

2. Background of the Invention

Increasingly, system on chip (SOC) integrated circuit (IC) designs have gained momentum. As a result, the increasingly complex ICs often require large amounts of embedded memories to fulfill the SOC's functional requirements. In addition, it has become increasingly important to minimize the size of ICs. One way to accomplish this minimization, while still providing increased memory capacity is to use embedded dynamic random access memory (DRAM).

As circuit dimensions decrease, manufacturing the necessary structures often becomes more difficult. This results in the embedded memory cells becoming more prone to random defects and subsequent failure. When this trend is combined with the tendency to pack more memory bits on a chip, an effective way to repair the failing memory elements through the allocation of redundant memory becomes necessary.

Prior methods of redundancy allocation for embedded memories are based on the use of a row and column memory, whereby internally generated column and row addresses of defective columns and rows are stored. Usually the number of failing addresses that can be stored is equal to the number of redundant elements available for repair. Typically, as part of a built in self test (BIST), gross fails that exceed a certain threshold in a particular dimension are assigned to be stored in one of the redundancy memories, either a row or column, in a "must fix" pass. A second test pass identifies "sparse fails", i.e., fails in a particular dimension that do not exceed the threshold used for determining gross fails, which are in turn stored in the remaining memory. This two-pass approach does not allow for optimum redundancy allocation as one cannot look at all the failing bits prior to assigning the redundancy.

SUMMARY OF INVENTION

One aspect of the present invention is an integrated redundancy architecture for providing BIST redundancy allocation to an embedded memory system. The architecture includes the following: a BIST for identifying and transmitting row and column addresses from failed embedded memory; a first memory element for storing row addresses that have been assigned for repair by row redundancy; a second memory element for storing repaired column addresses that have been assigned for repair by column redundancy; a third memory element for accumulating the failed row and column addresses transmitted from the BIST and assigning them a particular weight value based on the number of like addresses already accumulated in the third memory element and their relative locations within the memory system; and means for allocating redundancy resources of the memory system.

Another aspect of the present invention is an integrated circuit including the following: an embedded memory system having a plurality of row and column redundancies; a BIST for identifying row and column addresses of defective memory blocks in the embedded memory system; a first memory element for storing the repaired row addresses that have been assigned for repair by row redundancy; a second memory element for storing the repaired column addresses that have been assigned for repair by column redundancy; a third memory element for accumulating said row and column addresses identified by the BIST and assigning them a particular weight value based on the number of like addresses already accumulated in the third memory element and their relative locations within the memory system; and a finite state machine having a decision algorithm, the finite state machine in electrical communication with the first memory element, the second memory element, and the third memory element, the finite state machine allocating redundancy resources of the memory system according to the decision algorithm.

Still another aspect of the present invention is a method of providing BIST redundancy allocation to an embedded memory system, comprising the following steps: a) identifying failed row and column addresses of defective memory blocks in the embedded memory system; b) accumulating the failed row and column addresses identified in step a) in a third memory element; c) assigning failed row and column addresses accumulated in step b) a particular weight value based on the number of like addresses already accumulated and their relative locations within the memory system; and d) transferring the failed row and column addresses associated with the most fails from the third memory element to first and second memory elements according to a decision algorithm.

Other features, utilities and advantages of various embodiments of the invention will be apparent from the following more particular description of embodiments of the invention as illustrated in the accompanying drawings.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

The present invention is directed to an integrated redundancy architecture for an embedded memory system whereby a third memory element is added to the redundancy architecture such that all row and column fails may be stored in real-time. This allows more failure information to be accumulated prior to allocating redundant elements, providing for a more efficient use of redundancy.

Figure 1:
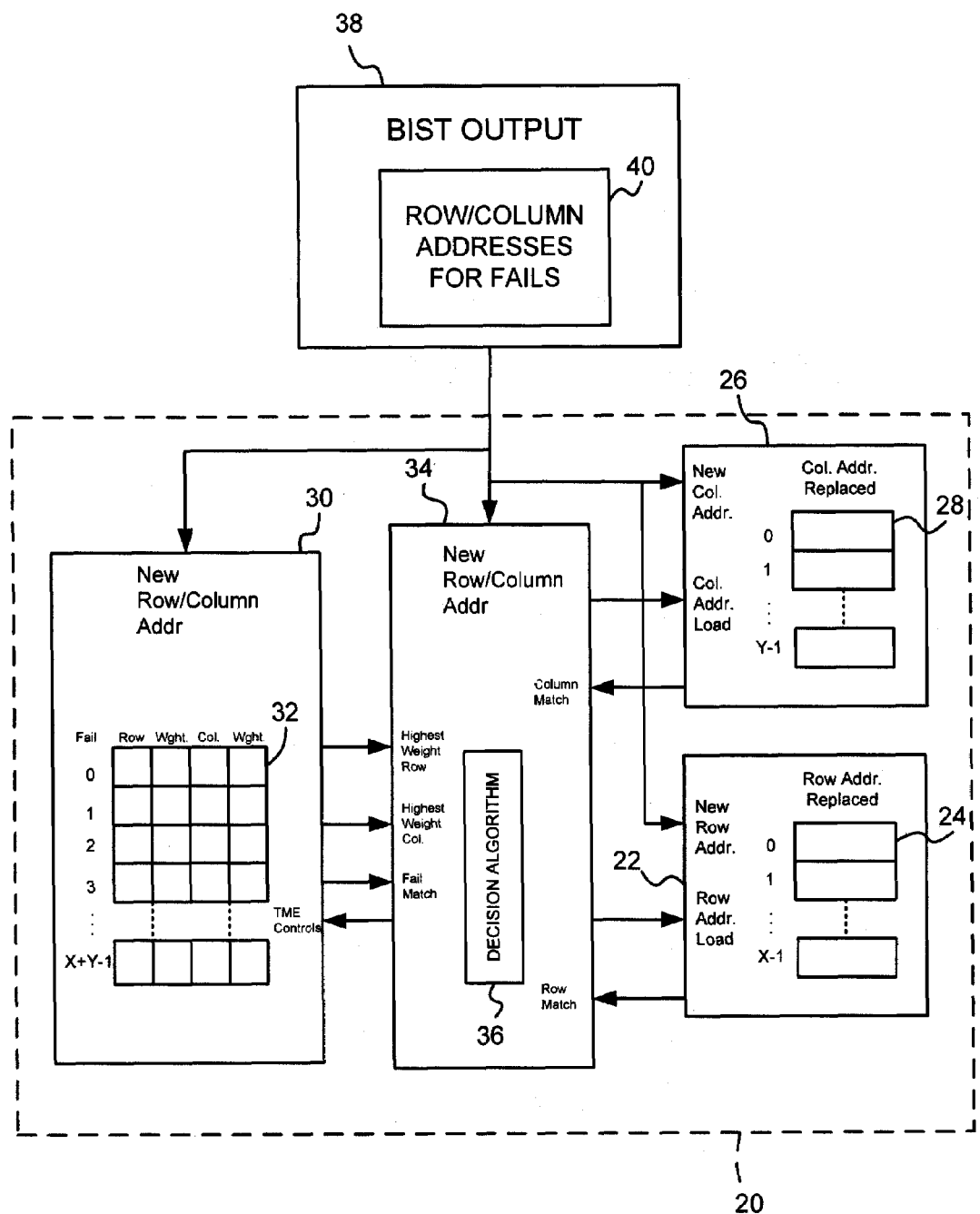
FIG. 1 is a block diagram of an integrated redundancy architecture according to one embodiment of the present invention.
Figure 2:
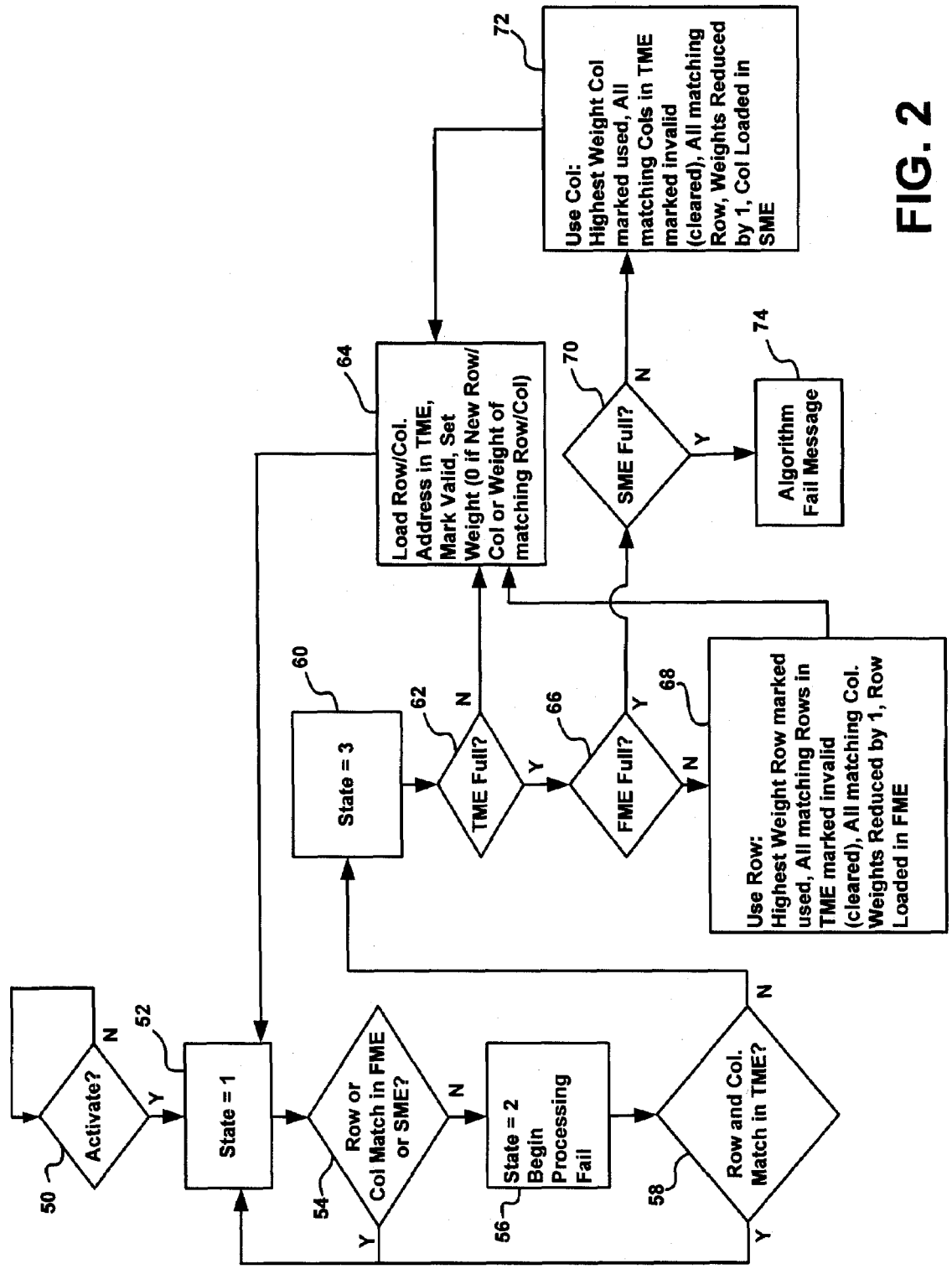
FIG. 2 is a flowchart of a redundancy allocation decision algorithm according to one embodiment of the present invention.

An example of the disclosed invention is depicted in FIGS. 1 and 2, although it should be understood that the present invention is not limited to this (or any other) particular embodiment, but rather is intended to cover any architectures, integrated circuits, and methods that fairly fall within the broad scope of the appended claims. In the drawings, like elements include like element numbers.

Referring now to the drawings, FIG. 1 illustrates an integrated redundancy architecture 20. Architecture 20 includes a first memory element 22 (FME 22) having a register 24, a second memory element 26 (SME 26) having a register 28, a third memory element 30 (TME 30) having a register 32, and a finite state machine 34 (FSM 34) having a decision algorithm 36. In one embodiment, content addressable memory (CAM) may be used for memory elements 22, 26, and 30. FME 22, SME 26, TME 30, and FSM 34 are electrically connected to a built-in self-test (BIST) module 38. During the test of an embedded memory the data obtained from the memory is compared to an expected value. Miscompares caused by defective memory elements result in a row and one or more column addresses being marked as failing. BIST module 38 then outputs these failed row and column addresses 40, also referred to as "fails," to FME 22, SME 26, TME 30, and FSM 34.

Architecture 20 operates as follows: failing row addresses from addresses 40 that have been determined to be most optimally repaired by a redundant row element, are stored in register 24 of FME 22. Failing column addresses from addresses 40 that have been determined to be most optimally repaired by a redundant column element are stored in register 28 of SME 26. TME 30 accumulates both the failed row and column addresses from addresses 40. It then assigns them particular weights based on how many fails have been found in each row or column dimension and on their relative locations to each other (the row or the column address are examined to see if they are the same as the other row or column addresses or if the row and column address pair is the same as any other row and column address pair currently stored in register 32 of TME 30). The row and column address pair entries in register 32 of TME 30 represent a single fail. Replacing either the row or the column with a redundant element will repair that fail, i.e., repair that particular row and that column address on that particular row. When register 32 is full, the highest weighted fail is assigned to either FME 22, i.e., the row redundancy memory or SME 26, i.e., the column redundancy memory, and the remaining register fail weights are adjusted. As described further below, the highest weighted fail is assigned to either FME 22 or SME 26 based on decision algorithm 36 in FSM 34. After the highest weighed fail is assigned (repairing that fails row and column address pair), the next new fail from BIST module 38 is entered into the newly created empty slot in register 32.

Referring now to FIG. 2, a flowchart including the steps of decision algorithm 36 of FSM 34 (see FIG. 1) is illustrated. First, at step 50, it is determined whether to activate algorithm 36. The status of the BIST module 38 determines whether algorithm 36 is activated. If the BIST module 38 is not active, step 50 is repeated. If the BIST module 38 is active, at step 52, FSM 34 is set to its initial state, i.e., state "1" and decision algorithm 36 is activated.

At step 54, the first step of algorithm 36, the failed row and column addresses 40 from the BIST module 38 are compared to the row and column addresses already stored in FME 22 and SME 26, respectively. For each failed row address and each failed column address of addresses 40, if the address matches an address in either FME 22 or SME 26, then the fail is ignored and the FSM 34 is reset to state 1 at step 52. If no match is found, i.e., if the fail is a valid fail or one not already marked for repair by either a column or row redundant element, then FSM 34 enters state "2" at step 56.

At step 58, algorithm 36 of FSM 34 compares the new address fail to fails already stored in register 32 of TME 30. If register 32 contains a fail entry with the exact same row and column address, i.e., indicating the exact same fail has been encountered before but not yet allocated to FME 22 or SME 26 for repair, then the fail is ignored and FSM 34 is reset to state 1 at step 52.

If no match is found at step 58, FSM 34 is set to state "3" at step 60. During state 3, algorithm 36 finishes processing the new fail. At step 62, it is determined whether TME 30 is full. If TME 30 is not full, then, at step 64, addresses 40 are entered into register 32 of the TME 30, and the row and column weights of any fails with the same row or column address are increased. This is done because matching row and/or column addresses indicate that a single redundant element can be used to more efficiently replace multiple failing addresses. A higher weight indicates more replacement efficiency, so this weight will be taken into account when determining how to repair the failing addresses. After the weights for the addresses in register 32 of the TME 30 are adjusted, the new addresses 40 are assigned an initial weight. If the new addresses 40 do not match any addresses currently in register 32 of the TME 30 then they are assigned the lowest weight possible. If the new addresses 40 do match addresses currently in register 32 of the TME 30 then the row portion of addresses 40 receives the weight of the other matching rows, and the column portion of addresses 40 receives the weight of the other matching columns. FSM 34 is then returned to state 1 at step 52.

If TME 30 is full, then algorithm 36 attempts to make space in the TME for the new fail. First, at step 66, it is determined if there is space in FME 22, i.e., not all the row redundancy has been used. If there is space in FME 22, then, at step 68, the row address associated with the most fails is transferred from TME 30 to the FME. This action repairs the most fails possible using a single redundant element, since a higher weight indicates more fails have been found on that row than any other. When the highest weighted row is assigned to FME 22 that row and column address pair are replaced by a redundant element, so all fails on that row are fixed and that column fail on that row is also repaired. This results in all fails with the same row address simultaneously marked invalid, i.e., cleared from TME 30, and any fails with matching column addresses have their weights reduced by one. The FSM 34 is reset to state 1 and the space in TME 30 created by the transfer in step 68 is then used to store the new fail. If there is no space in FME 22, then, at step 70, it is determined whether there is any space available at SME 26. If there is space in SME 26, then, at step 72, the same process, i.e., described for FME 22 with respect to step 68 above, is used to transfer the column address with the highest weight to SME 26. Upon completion of step 72, FSM 34 is reset to state 1.

If neither FME 22 nor SME 26 have available memory for storing addresses, then, at step 74, a message indicating that the fails in the current repair region exceed what the redundancy can repair is output.

When the BIST of a repair region is complete, the fails that remain in the TME 30 are allocated, based on highest-weight-first to any remaining space in the FME 22 and then the SME 26. TME 30 and FSM 34 are then reused to test the next repair region. When the BIST is completed, the FME 22 and SME 26 for a particular repair region now contain the addresses repaired by redundancy. During subsequent normal array operation (non BIST), any operation addressed to that repair region need only be compared with the addresses in the FME 22 and SME 26 to be steered to the correct redundancy information, if that address has been replaced.

Redundancy schemes for embedded DRAMs generally require rapid redundancy allocation without adding considerable complexity to the memory system. As a result; novel techniques that provide for enhancements in BIST redundancy allocation and testing for embedded memories are of great value. The redundancy architecture scheme of the present invention provides an optimized redundancy allocation scheme in that it is based on a knowledge of all catalogued fails. As follows, the redundancy calculation is more flexible and produces better redundancy usage, particularly for sparse fails.

The architecture and methodology of the present invention may also enhance yields. This results from the fact that chips having certain defects are often found to be unrepairable using prior art architectures. Whereas an architecture that utilizes the present invention would be likely to properly diagnose and repair the same chip defect.

Another benefit of the present invention is that test times are typically reduced due to the fact that only one pass is required. In the methodology of the present invention, the memory is tested, all the fails are recorded, and the redundancy solution is derived from knowledge of all the redundancy data, compared to a bit-by-bit approach (used in the prior art) which takes multiple passes to complete.

In addition, the use of a temporary register, i.e., register 32 of TME 30, allows for real-time, at-speed testing and provides for testing across repair regions without stopping the test to off-load repairs. When testing of a repair region is complete all fails are repaired and the TME 30 emptied and available for reuse in processing of the next repair region. No information needs to the leave the chip for temporary storage as in many other prior redundancy allocation schemes. The methodology of the present invention easily allows for reuse of redundancy storage elements FSE 22 and SME 26 for storing downloaded fused redundancy information.

Finally, the architecture of the present invention allows for a size reduction in the redundancy allocation logic compared to most prior methods, as implementation is independent of embedded DRAM density and I/O width.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. An integrated redundancy architecture for providing BIST redundancy allocation to an embedded memory system, the integrated redundancy architecture comprising:
   a BIST for identifying and transmitting row and column addresses of failed memory cells of embedded memory;
   a first memory element for storing, as to-be-repaired row addresses, ones of the row addresses assigned by said BIST for repair by row redundancy;
   a second memory element for storing, as to-be-repaired column addresses, ones of the column addresses assigned by said BIST for repair by column redundancy;
   a third memory element for accumulating ones of the row and column addresses of the failed memory cells not already contained in said first and second memory elements and for assigning each of the row and column addresses accumulated in said third memory element a particular weight value based on the number of the row and column addresses already accumulated in said third memory element and the relative locations within the memory system of the row and column addresses accumulated in said third memory element; and
   a means for:
      determining whether the row address of a failed memory cell matches any of the to-be-repaired row addresses stored in the first memory element;
      determining whether the column address of the failed memory cell matches any of the to-be-repaired column addresses stored in the second memory element;
      if the row address of the failed memory cell does not match any of the to-be-repaired row addresses stored in the first memory element and the column address of the failed memory cell does not match any of the to-be-repaired column addresses stored in the second memory element, storing the row and column addresses of the failed memory cell in the third memory element;
      if either the row address of the failed memory cell matches one of the to-be-repaired row addresses stored in the first memory element or the column address of the failed memory cell matches one of the to-be-repaired column addresses stored in the second memory element, or both, then:
         determining whether the row address of another failed memory cell matches any of the to-be-repaired row addresses stored in the first memory element; and
         determining whether the column address of the another failed memory cell matches any of the to-be-repaired column addresses stored in the second memory element.

2. An integrated redundancy architecture according to claim 1, wherein said first, second, and third memory elements include the function of content addressable memory.

3. An integrated redundancy architecture according to claim 1, wherein said first memory element includes a register for storing row addresses that have been assigned for repair by row redundancy.

4. An integrated redundancy architecture according to claim 1, wherein said second memory element includes a register for storing column addresses that have been assigned for repair by column redundancy.

5. An integrated redundancy architecture according to claim 1, wherein said third memory element includes a register for accumulating the failed row and column addresses transmitted from said BIST.

6. An integrated redundancy architecture according to claim 1, further comprising a finite state machine having a decision algorithm, said finite state machine in electrical communication with said first memory element, said second memory element, and said third memory element.

7. An integrated redundancy architecture according to claim 6, wherein said finite state machine allocates redundancy resources of said memory system according to said decision algorithm.

8. An integrated circuit comprising:
   an embedded memory system having a plurality of row and column redundancies;
   a BIST for identifying row and column addresses of defective memory blocks in said embedded memory system;
   a first memory element to store, as to-be-repaired row addresses, row addresses identified by said BIST to be repaired by row redundancy;
   a second memory element to store as to-be-repaired column addresses column addresses identified b said BIST to be repaired by column redundancy;
   a third memory element for accumulating ones of the row and column addresses of said defective memory block identified by said BIST that are not already stored in said first and second memory elements and assigning them a particular row or column weight value based on the number of like addresses already accumulated and still resident in said third memory element and their relative locations within the memory system; and means for:
- determining whether the row address of a failed memory cell matches any of the to-be-repaired row addresses stored in the first memory element;
- determining whether the column address of the failed memory cell matches any of the to-be-repaired column addresses stored in the second memory element;
- if the row address of the failed memory cell does not match any of the to-be-repaired row addresses stored in the first memory element and the column address of the failed memory cell does not match any of the to-be-repaired column addresses stored in the second memory element, storing the row and column addresses of the failed memory cell in the third memory element;
- if either the row address of the failed memory cell matches one of the to-be-repaired row addresses stored in the first memory element or the column address of the failed memory cell matches one of the to-be-repaired column addresses stored in the second memory element, or both, then:
  - determining whether the row address of another failed memory cell matches any of the to-be-repaired row addresses stored in the first memory element; and
  - determining whether the column address of the another failed memory cell matches any of the to-be-repaired column addresses stored in the second memory element.

9. An integrated circuit according to claim 8, further comprising a finite state machine having a decision algorithm, said finite state machine in electrical communication with said first memory element, said second memory element, and said third memory element.

10. An integrated circuit according to claim 9, wherein said finite state machine allocates redundancy resources of said memory system according to said decision algorithm.

11. An integrated circuit according to claim 8, wherein at least one of said first, second, and third memory elements include content addressable memory.

12. An integrated circuit according to claim 8, wherein said first memory element includes a register for storing said failed row addresses.

13. An integrated circuit according to claim 8, wherein said second memory element includes a register for storing said failed column addresses.

* * * * *